United States Patent [19]

Wojcik

[11] Patent Number: 4,720,402
[45] Date of Patent: Jan. 19, 1988

[54] METHOD FOR DISPENSING VISCOUS MATERIAL

[75] Inventor: Thaddeus Wojcik, Hopewell, N.J.

[73] Assignee: American Telephone and Telegraph Company, New York, N.Y.

[21] Appl. No.: 4,200

[22] Filed: Jan. 30, 1987

[51] Int. Cl.⁴ ............................................. B05D 5/12
[52] U.S. Cl. ...................................... 427/282; 427/96
[58] Field of Search ................... 427/282, 96; 118/406, 118/415

[56] References Cited

U.S. PATENT DOCUMENTS

| | | | |
|---|---|---|---|
| 3,464,351 | 9/1969 | De Hart et al. | 101/126 |
| 4,072,777 | 2/1978 | Schoenthaler | 427/433 |
| 4,323,593 | 4/1982 | Tsunashima | 427/282 X |
| 4,424,762 | 1/1984 | Tanaka et al. | 118/410 |
| 4,515,297 | 5/1985 | Schoenthaler et al. | 222/160 |
| 4,622,239 | 11/1986 | Schoenthaler et al. | 427/282 X |

*Primary Examiner*—Evan K. Lawrence
*Attorney, Agent, or Firm*—Robert B. Levy

[57] ABSTRACT

The present invention relates to a method for depositing a viscous material (11), such as solder paste, onto a substrate (16), such as a printed circuit board. The solder paste is expelled (12) out from a dispenser (20) into a void between a pair of flexible members (30) extending therefrom for contact with a foraminous member (12) such as a stencil, proximate the printed circuit board. A relative motion is imparted between the dispenser and the foraminous member so that at least one of the flexible members forces the solder paste through the openings in the stencil and onto the circuit board. In accordance with the invention, the dispenser is pivoted when the relative motion is imparted between the dispenser and the stencil to raise the leading one of the flexible members a predetermined distance from the stencil. In this way, the solder paste expelled from the dispenser will remain substantially confined between the flexible members, yet be allowed to mix with whatever portion of the solder paste (typically flux) remains on the stencil after the previous pass of the dispenser thereacross.

6 Claims, 3 Drawing Figures

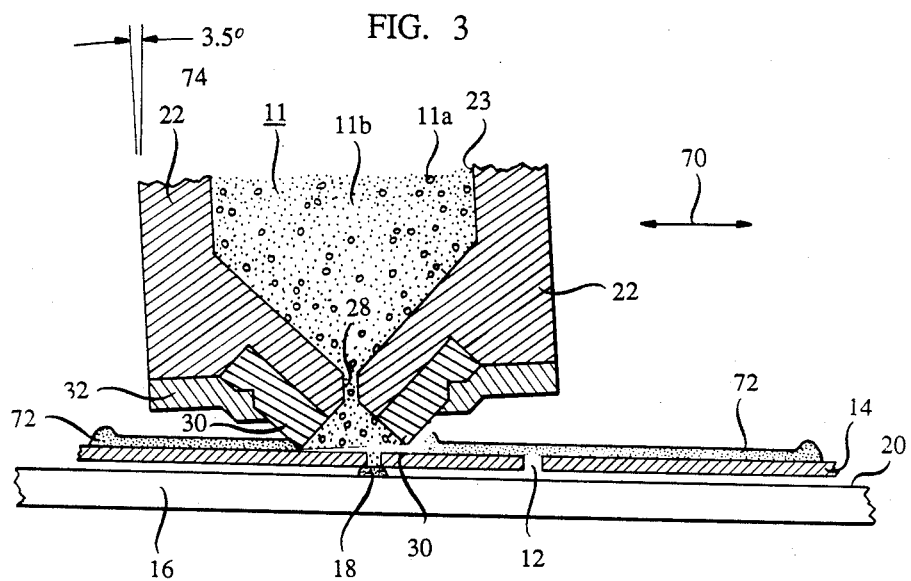

METHOD FOR DISPENSING VISCOUS MATERIAL

TECHNICAL FIELD

This invention relates to a method of dispensing a viscous material, such as solder paste, through openings in a foraminous member, such as a stencil.

BACKGROUND OF THE INVENTION

Recent advances in the field of semiconductor technology have led to the development of chip carrier packages. A chip carrier package is generally comprised of a planar housing having a semiconductor chip therein. Conductive members, either in the form of metallized pads on the planar housing, or wire-like leads extending from the housing, serve to connect the semiconductor chip to a set of metallized areas on a printed circuit board. In addition to chip carrier packages, other types of electronic components, such as resistors and capacitors, for example, have also been developed for mounting to the metallized areas on the surface of the printed circuit board. The term "surface-mounted component" is commonly used to generically describe any type of electronic component which is designed for mounting to the metallized areas on the surface of a printed circuit board.

Currently, surface-mounted components are mounted on a printed circuit board to form an article, referred to as a "circuit pack," by the following process. First, a controlled amount of a reflowable bonding material (e.g., solder paste) is applied to the metallized areas on the printed circuit board. Next, the surface-mounted component is placed on the printed circuit board so each of the conductive members of the component contacts a separate one of the solder paste-coated, metallized areas. In practice, the solder paste is tacky and serves to adhere the conductive members of the component to the metallized areas. Thereafter, the printed circuit board and the surface-mounted component are heated to reflow the solder paste to create a bond between each conductive member of the component and each metallized area on the printed circuit board.

Generally, the solder paste is selectively deposited (printed) onto the metallized areas on the board by forcing the paste through openings in a foraminous member, typically a stencil, placed proximate with the printed circuit board so as to be spaced a short distance thereabove. The openings in the stencil are arranged in a pattern corresponding to that of the metallized areas on the board to be coated with the solder paste. The process of forcing the paste through the openings in the stencil is accomplished by depositing the paste on the stencil and then sweeping a flexible member (e.g., squeegee or doctor blade) thereacross. Usually, the metallized areas on the printed circuit board exposed through the openings in the stencil can be coated with solder paste after one or two passes of the squeegee blade across the stencil.

An apparatus designed for printing solder paste onto a printed circuit board is disclosed in U.S. Pat. No. 4,622,239 (hereby incorporated by reference), issued on Nov. 11, 1986, in the names of D. Schoenthaler and T. Wojcik and assigned to AT&T Technologies Inc. The Schoenthaler et al. solder paste dispensing apparatus comprises a housing containing a quantity of solder paste. The housing has a bottom opening located between a pair of flexible members (squeegee or doctor blades) which extend from the housing for contacting the stencil. In operation, the solder paste is forced out from the opening in the housing so as to be confined between the flexible members. As the solder paste is expelled from the housing, a relative motion is imparted between the stencil and the housing so the flexible members force the solder paste confined therebetween into the stencil openings.

In practice, both of the flexible members remain in contact with the stencil so the solder paste is confined between the flexible members, and thus the exposure of the expelled solder paste to the atmosphere is reduced. In this way, premature drying of the solder paste is substantially prevented.

When printing extremely viscous solder paste (e.g., ≧700,000 centapoise) with the Schoenthaler et al. dispenser, problems can arise. As the solder paste is dispensed, the solder paste adjacent to the trailing one of the flexible members will experience a very high shear force. This shear force separates the paste into its constituent components (e.g., solder spheres and a suspending viscous flux). Some of the flux tends to pass underneath the trailing flexible member, forming a thin (0.0005" thick) flux film on the stencil. After repeated printing of the solder paste on the stencil, the solder paste confined between the flexible members becomes substantially depleted of flux. This is because during each pass of the dispensing apparatus across the stencil, the flux film left thereon during the prior pass of the dispenser is pushed ahead and off to the end of the stencil by the leading flexible member.

Since the flux is pushed ahead and off to the end of the stencil, the solder paste confined between the flexible members does not mix therewith and remains depleted of flux. The deposited solder paste, when depleted of flux, tends to remain in the stencil openings instead of adhering to the metallized areas on the printed circuit board. Consequently, the stencil must be removed and cleaned, with the attendant cost in downtime.

In contrast, the problem of clogging is usually not experienced by the solder paste printing apparatus which employs a single squeegee or doctor blade. The solder paste printed by a conventional, single squeegee blade apparatus will also experience high shear forces, causing the solder paste to separate and the deposition of a thin film of flux on the stencil. However, as the conventional solder paste printing apparatus is moved in opposite directions across the stencil, the solder paste leaving the dispensing apparatus is mixed by the single squeegee blade of the dispenser with the flux film previously left on the stencil. In this way, any change in the flux content of the solder paste forced into the stencil openings is small and clogging of the stencil is avoided. However, the paste printed by a conventional single squeegee blade solder paste apparatus is not shielded from exposure to the atmosphere, causing premature drying of the solder paste. This necessitates cleaning of the apparatus, with the attendant downtime associated therewith.

Accordingly, there is a need for a method for printing a highly viscous material, such as solder paste, through openings in a stencil without the clogging of the stencil openings and drying of the material.

BRIEF SUMMARY OF THE INVENTION

The present invention involves the depositing of viscous material from a dispenser onto a foraminous member so the viscous material is substantially confined in a void between a pair of flexible members extending from the dispenser for contact with the foraminous member. In accordance with the invention, when a relative motion is imparted between the dispenser and the foraminous member, the leading one of the flexible members is raised from the surface of the foraminous member a predetermined distance. In this way, the viscous material expelled from the dispensing apparatus can be kept substantially confined between the flexible members. Yet the viscous material confined between the blades will mix with whatever portion of the viscous material remains on the foraminous member after a relative motion has been previously imparted between the dispensing apparatus and the foraminous member. The mixing of the viscous material confined substantially between the blades with the portion of the viscous material previously deposited on the foraminous member serves to maintain the consistency of the viscous material forced into the openings of the foraminous member substantially constant.

BRIEF DESCRIPTION OF THE DRAWINGS

FIG. 3 is a partial view of the dispensing apparatus of FIG. 1 during the dispensing of viscous material thereby onto the stencil by the method of the present invention.

DETAILED DESCRIPTION

Figure 1:
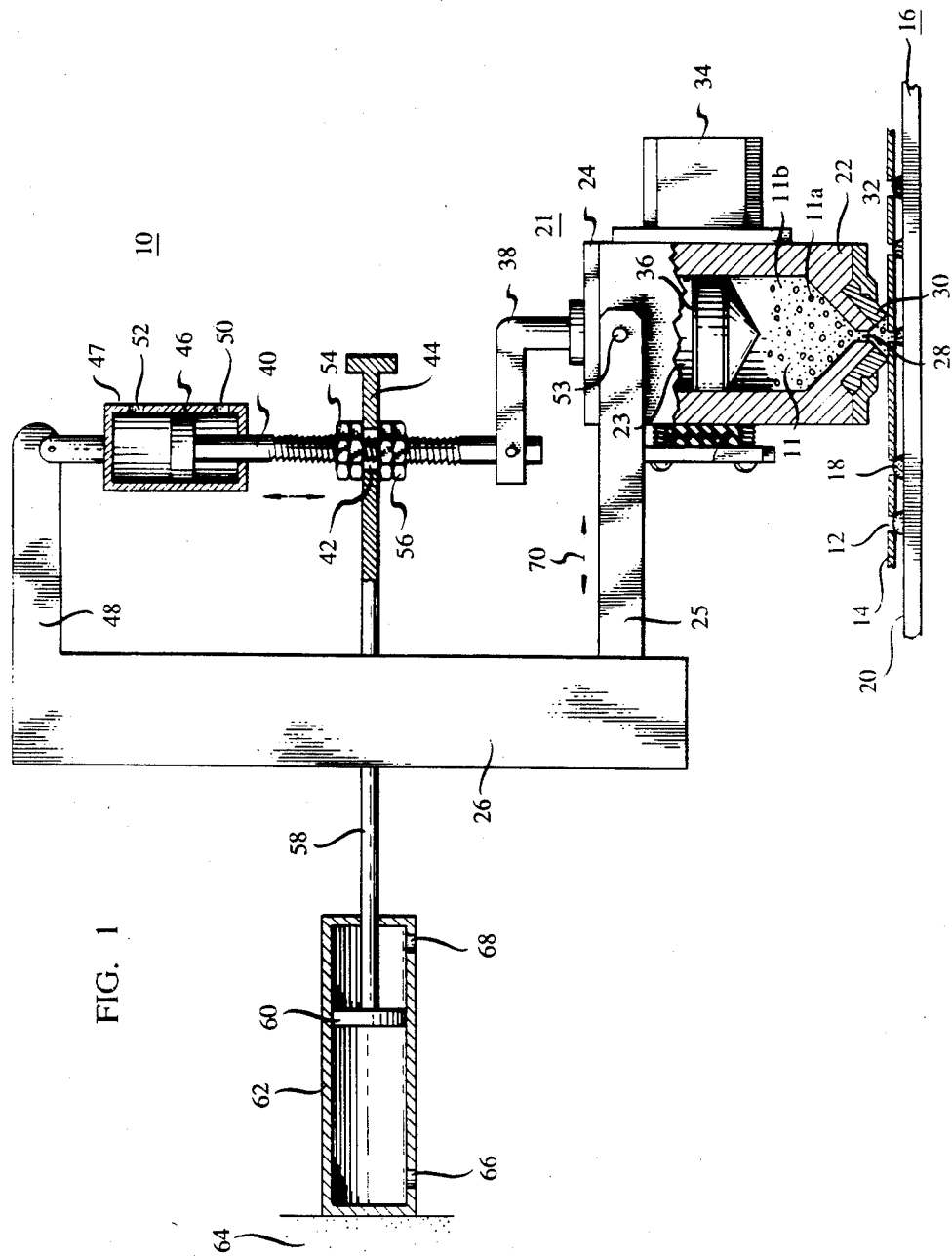
FIG. 1 is an end view in cross section of an apparatus for dispensing viscous material onto a stencil.

FIG. 1 is a cross-sectional end view of a system 10 for dispensing a viscous material 11 (typically solder paste, comprising a mixture of solder spheres 11a suspended in a flux 11b) through each of a plurality of openings 12 in a foraminous member 14 (e.g., a stencil). The stencil 14 is typically located proximate (e.g., $\leq 0.010''$ above) a substrate 16 (e.g., a printed circuit board) having metallized areas 18 on a major surface 20 thereof. In practice, the stencil openings 12 are each in registration with a corresponding one of the metallized areas 18 on the printed circuit board 16 to be coated with the solder paste 11.

The system 10 includes a dispensing apparatus 21 constructed in accordance with the teachings of the above-mentioned Schoenthaler et al. patent. The apparatus 21 comprises a hollowed-out housing 22 having a cavity 23 therein sealed by way of a cover 24. The housing 22 is pivotally mounted to each of a pair of arms 25 extending horizontally from a carriage assembly 26 slidably supported above the stencil 14 for movement thereacross by means (not shown). The housing 22 of the dispensing apparatus 20 has an opening 28 in the bottom thereof. Each of a pair of flexible members 30 (e.g., squeegee blades) is each secured by a separate one of a pair of clamps 32 to the bottom of the housing 22 on opposite sides of the opening 28 therein. Each flexible member 30 extends from the housing 22 for contacting the stencil 14.

A manifold 34 communicates with the cavity 23 in the housing 22 for carrying the solder paste 11 from a supply (not shown) into the housing uniformly beneath a piston 36 slidably mounted in the cavity. A fluid port or the like (not shown) is provided through the cover 24 for admitting a pressurized fluid into the cavity 23 above the piston 36 so as to bias the piston towards the opening 28. As the piston 36 is urged towards the opening 28, the solder paste 11 in the cavity 23 will be expelled through the opening and onto the stencil 14 so as to be confined in a void between the flexible members 30.

The cover 24 at the top of the housing 22 is attached to one end of an "L"-shaped arm 38 whose opposite end is pivotally connected to one end of a shaft 40 which passes through an opening 42 in an extension 44 projecting horizontally from the carriage assembly 26. The other end of the shaft 40 carries a piston 46, which moves slidably within a cylinder 47 pivotally mounted to an overhang 48 extending from the carriage assembly 26 parallel to the extension 44. Each of a pair of fluid ports 50 and 52 communicates with the cylinder 47 on opposite sides of the piston 46. When pressurized fluid is alternately admitted through each of the fluid parts 50 and 52, the shaft 40 will be reciprocated in opposite directions, causing the dispensing apparatus 20 to pivot about an axis 53 normal to the plane of the drawing. Each of a pair of nuts 54 and 56 is threaded onto the shaft 40 above and below, respectively, the extension 44. By adjusting the spacing of the nuts 54 and 56 from the extension 44, the degree to which the housing 22 pivots about the axis 53 can be controlled. Rather than employ the nuts 54 and 56 threaded on the shaft 40, other mechanisms could be employed to control the degree of pivot of the housing 22 about the axis 53.

The carriage assembly 26 is connected to one end of a shaft 58 whose opposite end carries a piston 60 which slidably moves within a cylinder 62 rigidly attached to a fixedly-mounted member 64. A pair of fluid ports 66 and 68 each communicates with the cylinder 62 on opposite sides of the piston 56 therein. By alternately admitting pressurized fluid into the fluid ports 66 and 68, the shaft 58 will be reciprocated back and forth, causing the carriage assembly 26 and the dispensing apparatus 20 to be displaced back and forth across the stencil 14 along an axis 70 parallel to the plane of the stencil 14.

Figure 2:
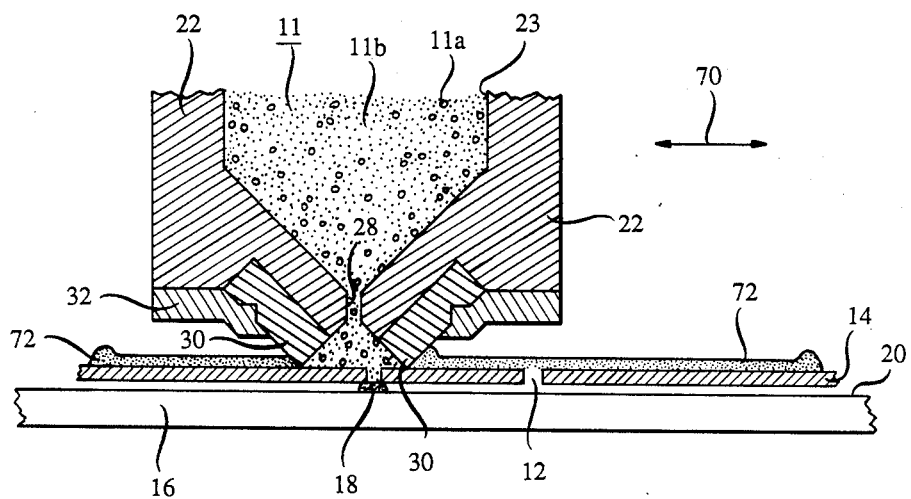
FIG. 2 is a partial view of the dispensing apparatus of FIG. 1 during the dispensing of viscous material thereby onto the stencil by a known method.

Referring to FIG. 2, during the movement of the housing 22 across the stencil 14, the flux 11b within the solder paste 11 confined between the flexible members 30 tends to escape underneath the trailing flexible member, leaving a flux film 72 on the stencil. When both the flexible members 30 are kept in contact with the stencil 14, the flux film 72 is pushed ahead by the leading flexible member. Thus there is not mixing of the flux film 72 with the flux-starved solder paste 11 confined between the flexible members 30. This leads to clogging of the stencil 14.

The problem of clogging of the stencil 14 can be substantially avoided by pivoting the housing 22 to raise a leading one of the flexible members 30 so it clears the flux film 72 on the stencil 14 when the housing 22 is displaced thereacross, as seen in FIG. 3. Referring to that figure, just as the housing 22 is displaced rightwardly across the stencil 14, the cylinder 47 is pressurized by admitting fluid into the fluid port 52 to raise the leading (right-hand) one of the flexible members 30. Just as the housing 22 is displaced leftwardly across the stencil 14, the cylinder 47 is pressurized by admitting fluid into the fluid port 50 so the housing is pivoted in the opposite direction to raise the leading (left-hand) one of the flexible members 30 so it just clears the flux film 72.

In practice, the housing 22 is pivoted about 3.5° from an axis normal to the plane of the stencil 14 which should theoretically raise the leading one of the flexible members approximately 0.020" therefrom. However, due to the pressure of the trailing one of the flexible members 30 on the stencil 14, and the resultant deflection caused thereby, the actual distance between the leading one of the flexible members and the stencil will actually be on the order of 0.007–0.010". Even when spaced 0.007–0.010" from the stencil 14, the leading one of the flexible members 30 will still clear the flux film 72 which is typically 0.0005" thick. When dispensing other types of viscous material, the exact arc through which the housing 22 must be pivoted will vary depending on the thickness of the film left on the stencil 14.

By pivoting the housing 22 in the manner described above during each pass thereof across the stencil 14, the flux film 72 left on the stencil will be mixed by the trailing one of the flexible members 30 with the solder paste 11 expelled from the housing. In this way, the quantity of the flux 11b within the solder paste 11 forced into the stencil openings 12 will be maintained substantially constant, thus reducing the likelihood of clogging. Also, by pivoting the housing 22 so that the leading one of the flexible members 30 just clears the flux film 72 on the stencil 14, the solder paste 11 expelled from the housing 22 will remain substantially confined between the flexible members 30. Thus, the solder paste 11 expelled from the housing 22 will remain substantially shielded by the flexible members 30 from the atmosphere, reducing the likelihood that the solder paste will dry out.

It is to be understood that the embodiments described herein are merely illustrative of the principles of the invention. Various modifications and changes may be made thereto by persons skilled in the art which will embody the principles of the invention and fall within the spirit and scope thereof. For example, while the instant method has been described with respect to the dispensing of solder paste, the method may be equally useful for dispensing other types of viscous materials, such as inks and RTV sealants having a viscosity between 0.2 and $2.0 \times 10^6$ centapoise. Also, the invention may be practiced by raising the leading one of the flexible members 30 in a manner other than pivoting the housing 22.

What is claimed is:

1. A method for fabricating an article comprising the steps of:
   expelling a viscous material from a dispenser into a void between a pair of flexible members extending from said dispenser for contact with a foraminous member overlying a substrate;
   imparting a relative motion between said dispenser and said foraminous member so that said viscous material expelled from said dispenser is urged by at least one of said pair of flexible members through openings in said foraminous member and onto said substrate; and
   completing the fabrication of said article, Characterized in That said step of imparting a relative motion includes the step of:
   raising a leading one of said pair of flexible members a predetermined distance from said foraminous member while simultaneously keeping the viscous material expelled from said dispenser substantially confined between said flexible members.

2. The method according to claim 1, Characterized in That said dispenser is pivoted to raise said leading flexible member said predetermined distance.

3. The method according to claim 2, Characterized in That said relative motion is imparted between said dispenser and said foraminous member to displace said dispenser alternately in opposite directions across said foraminous member, and said dispenser is alternately pivoted in opposite directions to raise the leading one of said pair of flexible members said predetermined distance from said foraminous member.

4. A method for fabricating an article comprising the steps of:
   expelling solder paste from a dispenser into a void between a pair of flexible members extending from said dispenser for contact with a stencil overlying a substrate;
   imparting a relative motion between said dispenser and said stencil so that said solder paste expelled from said dispenser is urged by at least one of said pair of flexible members through openings in said stencil and onto said substrate; and
   completing the fabrication of said article, Characterized in That said step of imparting a relative motion includes the step of:
   raising a leading one of said pair of flexible members a predetermined distance from said stencil while simultaneously keeping the solder paste expelled from said dispenser substantially confined between said flexible members.

5. The method according to claim 4, Characterized in That said dispenser is pivoted to raise the leading flexible member said predetermined distance.

6. The method according to claim 5, Characterized in That said relative motion is imparted between said dispenser and said stencil to displace said dispenser alternately in opposite directions across said stencil, and said dispenser is alternately pivoted in opposite directions to raise said leading one of said pair of flexible members said predetermined distance from said stencil.

* * * * *